(12) United States Patent
Chen et al.

(10) Patent No.: US 9,307,655 B2
(45) Date of Patent: Apr. 5, 2016

(54) DISPLAY APPARATUS AND CIRCUIT BOARD MODULE THEREOF

(71) Applicant: AU Optronics Corporation, Hsin-Chu (TW)

(72) Inventors: Chih-Hung Chen, Hsin-Chu (TW); Po-Fu Huang, Hsin-Chu (TW); Chih-Hao Wang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 152 days.

(21) Appl. No.: 14/321,995

(22) Filed: Jul. 2, 2014

(65) Prior Publication Data
US 2015/0009633 A1   Jan. 8, 2015

(30) Foreign Application Priority Data
Jul. 4, 2013   (TW) .............................. 102124017 A

(51) Int. Cl.
| | |
|---|---|
| H05K 3/36 | (2006.01) |
| H05K 1/02 | (2006.01) |
| H05K 3/32 | (2006.01) |
| H05K 3/40 | (2006.01) |

(52) U.S. Cl.
CPC .............. *H05K 3/361* (2013.01); *H05K 1/0269* (2013.01); *H05K 3/323* (2013.01); *H05K 3/4015* (2013.01); *H05K 2201/0233* (2013.01); *H05K 2201/09745* (2013.01); *H05K 2201/09781* (2013.01); *H05K 2201/10136* (2013.01)

(58) Field of Classification Search
CPC ..... H05K 3/361; H05K 1/0269; H05K 3/323; H05K 3/4015; H05K 2201/0233; H05K 2201/09745; H05K 2201/09781; H05K 2201/10136; H05K 1/144; H05K 1/111
See application file for complete search history.

(56) References Cited

U.S. PATENT DOCUMENTS

| | | | | |
|---|---|---|---|---|
| 5,641,946 A | * | 6/1997 | Shim .................... | H01L 21/4853 174/260 |
| 6,573,460 B2 | * | 6/2003 | Roeters .................. | H05K 3/462 174/261 |
| 7,449,716 B2 | * | 11/2008 | Chen ....................... | H01L 22/12 257/48 |
| 2004/0177921 A1 | * | 9/2004 | Yamauchi ............... | H01L 24/29 156/277 |
| 2005/0179098 A1 | * | 8/2005 | Chan ................. | H01L 21/28097 257/412 |
| 2006/0014860 A1 | * | 1/2006 | Watanabe .......... | C08G 18/0823 523/457 |
| 2007/0144771 A1 | * | 6/2007 | Chen ...................... | H05K 3/361 174/260 |
| 2007/0173022 A1 | * | 7/2007 | Wang ................ | H01L 21/26506 438/272 |
| 2008/0102277 A1 | * | 5/2008 | Bae ........................ | H05K 3/323 428/403 |
| 2008/0170196 A1 | * | 7/2008 | Ebine .................. | G02F 1/13452 349/149 |
| 2008/0188053 A1 | * | 8/2008 | Ting .................. | H01L 21/28097 438/382 |
| 2008/0258227 A1 | * | 10/2008 | Wang .............. | H01L 21/823807 257/369 |

(Continued)

*Primary Examiner* — David M Sinclair
*Assistant Examiner* — Robert Brown
(74) *Attorney, Agent, or Firm* — WPAT, PC; Justin King

(57) ABSTRACT

A circuit board module includes a first circuit board, an electrically conductive structure, a first bump, a second circuit board and an electrically conductive film. The electrically conductive structure and the first bump are disposed on the supporting surface of the first circuit board. The electrically conductive structure and the first bump respectively have a first maximal thickness T1 and a second maximal thickness T2 along the normal direction of the supporting surface. The second circuit board is disposed on the electrically conductive structure and the first bump. The electrically conductive film is disposed between the second circuit board and the electrically conductive structure, and it has a plurality of electrically conductive particles. An average particle diameter D of the electrically conductive particles when undeformed satisfies: $0 < T2 - T1 \leq D$.

18 Claims, 6 Drawing Sheets

(56) References Cited

U.S. PATENT DOCUMENTS

| | | | |
|---|---|---|---|
| 2009/0068916 A1* | 3/2009 | Jang | B22F 1/025 445/24 |
| 2010/0221545 A1* | 9/2010 | Abe | C09J 9/02 428/406 |
| 2011/0095770 A1* | 4/2011 | Kurashima | G06F 3/044 324/679 |
| 2011/0102385 A1* | 5/2011 | Jung | G02F 1/13452 345/204 |
| 2011/0122356 A1* | 5/2011 | Saimen | H05K 1/0269 349/149 |
| 2011/0147048 A1* | 6/2011 | Yamamoto | H05K 3/282 174/126.1 |
| 2012/0228109 A1* | 9/2012 | Wang | H01G 5/16 200/600 |
| 2012/0299888 A1* | 11/2012 | Kim | G02F 1/13452 345/205 |
| 2012/0313262 A1* | 12/2012 | Suzuki | H01L 23/3128 257/777 |
| 2013/0120329 A1* | 5/2013 | Wang | G02F 1/13452 345/206 |
| 2014/0305683 A1* | 10/2014 | Li | H05K 1/14 174/254 |
| 2015/0372368 A1* | 12/2015 | Pinta | H05K 1/02 343/905 |

* cited by examiner

DISPLAY APPARATUS AND CIRCUIT BOARD MODULE THEREOF

RELATED APPLICATIONS

This application claims priority to Taiwan Application Serial Number 102124017, filed Jul. 4, 2013, which is herein incorporated by reference.

BACKGROUND

1. Technical Field

Embodiments of the present invention relate to a display apparatus. More particularly, embodiments of the present invention relate to a display apparatus and the circuit board module thereof.

2. Description of Related Art

Because having a small-size advantage, a liquid crystal display (LCD) has become one of the mainstream displays in modern life. In a common LCD, a operator mounts a chip on a flexible circuit board by using a chip on film (COF) technique, and connects the flexible circuit board between the thin-film transistor (TFT) and the PCB.

To connect the flexible circuit board to the PCB, an anisotropic conductive film (ACF) is general used as electrical connection therebetween. During the process for electrically connecting the flexible circuit board to the PCB, a force has to be exerted on the flexible circuit board or the PCB, so as to compress the conductive particles in the ACF. When the conductive particles are compressed to a certain extent, the function of electric connection can be achieved. Therefore, the determination of whether the conductive particles are compressed is important to determine whether the flexible circuit board and the PCB are electrically connected.

A current assembler has to adjust a microscope to a specific polarization state in advance to observe the indents on the PCB lead caused by the conductive particles, thereby determining whether the electrical connection is successful. However, such determination method relies on the assembler's experience, and is likely to cause misjudgments due to no quantity standards.

SUMMARY

Embodiments of the invention provide a display apparatus and the circuit board module thereof, which allows the operator to accurately determine whether the expected pressing ratio of conductive particles is achieved.

In accordance with one embodiment of the present invention, a circuit board module includes a first circuit board, an electrically conductive structure, a first bump, a second circuit board and an electrically conductive film. The first circuit board has a supporting surface having a normal direction. The electrically conductive structure is disposed on the supporting surface. The electrically conductive structure has a first maximal thickness T1 along the normal direction of the supporting surface. The first bump is disposed on the supporting surface, and it has a second maximal thickness T2 along the normal direction of the supporting surface. The first bump has a top surface and a first groove. The top surface is opposite to the supporting surface, and the first groove is disposed on the top surface. The second circuit board is disposed on the electrically conductive structure and the first bump. The electrically conductive film is disposed between the second circuit board and the electrically conductive structure, and it has a plurality of electrically conductive particles. An average particle diameter D of the electrically conductive particles satisfies: $0 < T2-T1 \leq D$ when undeformed.

In accordance with another embodiment of the present invention, a display apparatus includes a display panel, a first circuit board, a second circuit board, an electrically conductive structure, a first bump and an electrically conductive film. The second circuit board connects the display panel and the first circuit board. The first circuit board has a supporting surface having a normal direction. The electrically conductive structure is disposed on the supporting surface, and it has a first maximal thickness T1 along the normal direction of the supporting surface. The first bump is disposed on the supporting surface, and it has a second maximal thickness T2 along the normal direction of the supporting surface. The first bump has a top surface and a first groove. The top surface is opposite to the supporting surface. The first groove is disposed on the top surface. The electrically conductive film is disposed between the second circuit board and the electrically conductive structure. The electrically conductive film has a plurality of conductive particles. An average particle diameter D of the conductive particles satisfies: $0 < T2-T1 \leq D$ when undeformed.

In the foregoing embodiments, because the first bump has the first groove, when the second circuit board is pressed, which causes the pressing to the electrically conductive particles, a portion of the second circuit board is received in the first groove and presses against the surface in the first groove, so that the indentation is formed. Therefore, the operator can determine whether the electrically conductive particles are pressed based on whether the indentation is formed on the first bump. As such, the misjudgment can be prevented.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
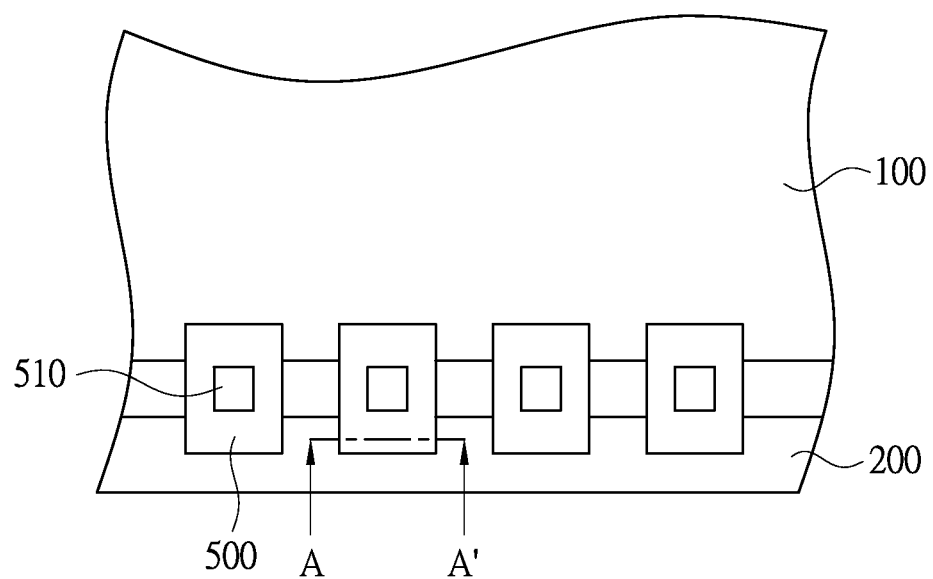
FIG. 1 is a partial top view of a display apparatus in accordance with the a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIG. 1 is a partial top view of a display apparatus 10 in accordance with the first embodiment of the present invention. As shown in FIG. 1, the display apparatus 10 includes a display panel 100, a first circuit board 200, a second circuit board 500 and a chip 510. The second circuit board 500 connects the display panel 100 and the first circuit board 200. In particular, the electrically conductive pattern or the metal trace on one edge of the second circuit board 500, such as the upper edge of the second circuit board 500 in this figure, can be electrically connected to the electrically conductive structure on a TFT array substrate (not shown) of the display panel 100, and the electrically conductive pattern or the metal trace on another edge of the second circuit board 500, such as the lower edge of the second circuit board 500 in this figure, can be electrically connected to the electrically conductive structure on the first circuit board 200. The chip 510 can be disposed on the second circuit board 500 by the technique of COF, so as to drive the display panel 100.

Figure 2:
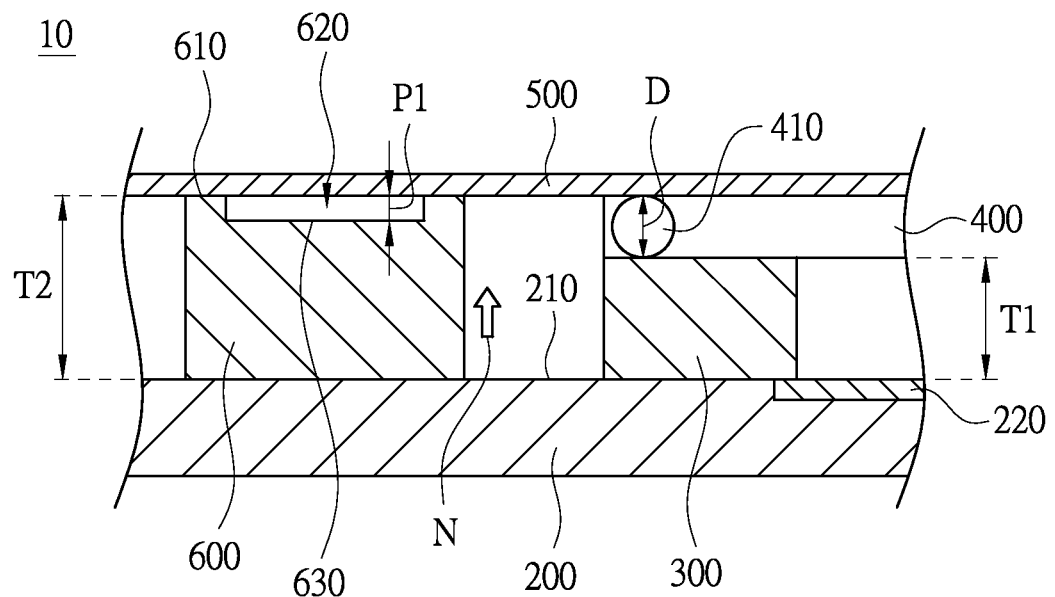
FIG. 2 is a partial cross-sectional view of the display apparatus 10 in FIG. 1 taken along A-A' line.

FIG. 2 is a partial cross-sectional view of the display apparatus 10 in FIG. 1 taken along A-A' line. In this embodiment, as shown in FIG. 2, the display apparatus 10 includes the first circuit board 200 and an electrically conductive film 400. The first circuit board 200 has a supporting surface 210. The first circuit board 200 includes an electrically conductive structure 300. The electrically conductive structure 300 is disposed on the supporting surface 210. The first circuit board 200 has an electrically conductive pattern 220 that is in contact with the electrically conductive structure 300, so that the electrically conductive structure 300 and the electric components on the first circuit board 200, such as the resistor or the capacitor not shown in the figure, can be electrically connected. The electrically conductive film 400 is disposed between the second circuit board 500 and the electrically conductive structure 300. The electrically conductive film 400 can be an anisotropic conductive film (ACF), which has a plurality of electrically conductive particles 410. The second circuit board 500 can be pressed toward the electrically conductive structure 300 by pressure welding, so as to compress the electrically conductive particles 410. When the electrically conductive particles 410 are compressed to a certain extent, the electrically conductive particles 410 may electrically connect the second circuit board 500 and the electrically conductive structure 300. It is understood that only one conductive particle 410 is shown for illustration clarity.

In order to determine whether the electrically conductive particles 410 are compressed, the first circuit board 200 includes a first bump 600. The first bump 600 is disposed on the supporting surface 210 of the first circuit board 200. The first bump 600 has a top surface 610, a first groove 620 and a dented surface 630. The top surface 610 is opposite to the supporting surface 210 of the first circuit board 200. In other words, the top surface 610 is the surface of the first bump 600 that is farthest away from the supporting surface 210. The first groove 620 is disposed on the top surface 610. The dented surface 630 is positioned in the first groove 620. In this embodiment, the dented surface 630 is parallel to the top surface 610. The supporting surface 210 has a normal direction N. The electrically conductive structure 300 has a first maximal thickness T1 along the normal direction N of the supporting surface 210. The first bump 600 has a second maximal thickness T2 along the normal direction N of the supporting surface 210. That is, the first maximal thickness T1 refers to the maximal size of the electrically conductive structure 300 measured along the normal direction N. Similarly, the second maximal thickness T2 refers to the maximal size of the first bump 600 measured along the normal direction N. The electrically conductive particles 410 have an average particle diameter D when uncompressed or undeformed. The relation among the first maximal thickness T1, the second maximal thickness T2 and the average particle diameter D satisfies: $0 < T2-T1 \leq D$.

Figure 3:
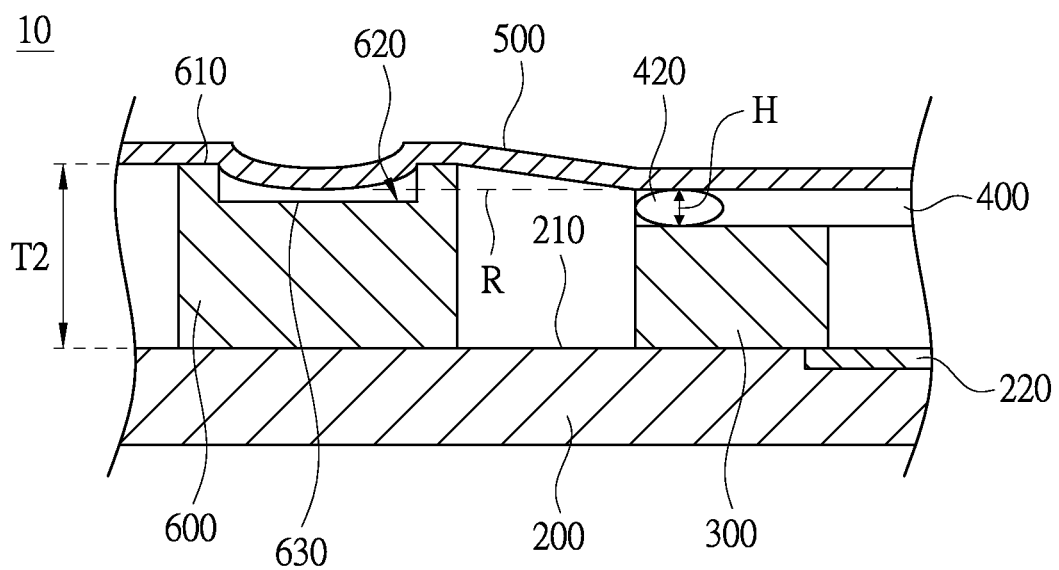
FIG. 3 is a partial cross-sectional view of a status of the second circuit board after compressed in FIG. 2.
Figure 4:
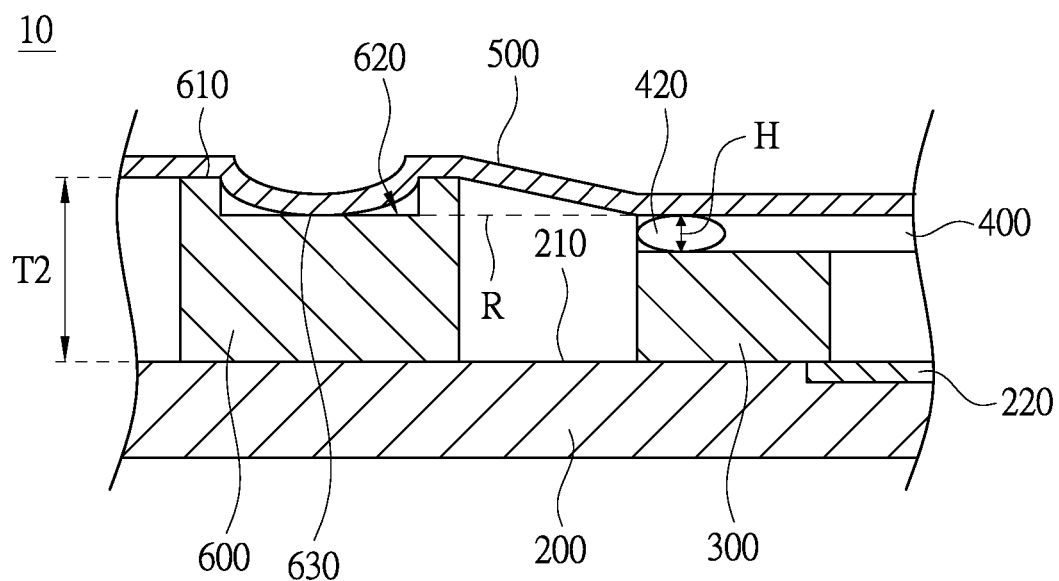
FIG. 4 is a partial cross-sectional view of another status of the second circuit board after compressed in FIG. 2.

In other words, the second maximal thickness T2 of the first bump 600 is at least greater than the first maximal thickness T1 of the electrically conductive structure 300. In such a configuration, when a portion of the second circuit board 500 is placed on the top surface 610 of the first bump 600, the electrically conductive particles 410 can be positioned between the electrically conductive structure 300 and another portion of the second circuit board 500. As shown in FIGS. 3 and 4, when the second circuit board 500 is pressed, a portion of the second circuit board 500 is received in the first groove 620. The displacement that the portion of the second circuit board 500 is pressed into the groove 600 is substantially equal to the reduced value of the thickness of at least one electrically conductive particle 420. As shown in the reference line R in FIGS. 3 and 4, the horizontal level of the lowest portion of the received second circuit board 500 is substantially the same as which of at least one compressed electrically conductive particles 420. During the pressing process, the non-deformed electrically conductive particles 410 (See FIG. 2) are compressed to become the deformed electrically conductive particles 420 (See FIG. 3). At this stage, the reduced value of the thickness of each electrically conductive particle 420 is not enough to allow the second circuit board 500 received in the first groove 620 to contact the dented surface 630. The electrically conductive particles 420 can be further compressed until the reduced value of the thickness is enough to allow the second circuit board 500 received in the first groove 620 to contact the dented surface 630, as shown in FIG. 4. In this way, the indentation can be generated on the second circuit board 500. In other words, when the indentation is shown, it means that the received second circuit board 500 is pressed deep enough to contact the dented surface 630. As such, the determination whether the electrically conductive particles 420 are compressed enough can be implemented by whether the indentation is shown on the portion of the second circuit board 500 corresponding to the first bump 600.

In this embodiment, as shown in FIG. 2, the difference between the second maximal thickness T2 of the first bump 600 and the first maximal thickness T1 of the electrically conductive structure 300 is substantially equal to the average particle diameter D. The first groove 620 has a maximal depth P1 along the normal direction N of the supporting surface 210. Therefore, when the indentation is shown, the maximal depth P1 of the first groove 620 can be regarded as the deformed or compressed value of at least one electrically conductive particle 420. For example, if the maximal depth P1 is 1 micrometer, the thickness of at least one deformed electrically conductive particle 420 is reduced at least 1 micrometer when the indentation is shown. As such, whether the reduced value of the thickness of at least one electrically conductive particle 420 is enough can be the determined based on the maximal depth P1 of the first groove 620. In other words, whether the thickness of at least one electrically conductive particle 420 is reduced at least 1 micrometer can be determined based on the maximal depth P1 of the first groove 620.

As used herein, "substantially" or "approximately" shall generally mean within 15 percent, preferably within 10 percent, and more preferably within 5 percent of a given value or range.

In this embodiment, as shown in FIGS. 2 and 4, when at least one non-deformed electrically conductive particle 410 is compressed to become the deformed electrically conductive particle 420, the deformed electrically conductive particle 420 becomes an elliptic sphere. The deformed electrically conductive particle has a particle height H. This particle height H refers to the size of the deformed electrically conductive particle 420 measured along the normal direction N. It is observed that the deformed conductive particle 420 is not broken when H/D>80%, such that the deformed conductive particle 420 may not electrically connect the second circuit board 500 and the electrically conductive structure 300; contrarily, the deformed electrically conductive particle 420 bears undue pressure when H/D<20%, such that the deformed conductive particle 420 may not electrically connect the second circuit board 500 and the electrically conductive structure 300. Hence, the relation between the particle height H and the particle diameter D preferably satisfies 20%≤H/D≤80%, so as to allow the deformed electrically conductive particle 420 to electrically connect the second circuit board 500 and the electrically conductive structure 300.

Therefore, in this embodiment, as shown in FIG. 2, the maximal depth P1 of the first groove 620 preferably satisfies: 0.2×D≤P1≤0.8×D. As such, when the indentation is shown on the second circuit board 500 over the first bump 600, the particle height H is at most 80 percent of the average particle diameter D of the non-deformed electrically conductive particle 410, so as to allow the deformed electrically conductive particles 420 to electrically connect the second circuit board 500 and the electrically conductive structure 300. In this configuration, whether the second circuit board 500 and the electrically conductive structure 300 are electrically connected can be determined based on whether the indentation is shown.

In this embodiment, the material of the first bump 600 can be insulating material, so as to avoid the electric components on the first circuit board 200 (not shown), or the chip 510 on the second circuit board 500 (See FIG. 1) affected by unnecessary electric effect. In other embodiments, the material of the first bump 600 can be electrically conductive material, and the first bump 600 is not in contact with the electrically conductive pattern 220 or other metal trace of the first circuit board 200, so as to avoid the electric components on the first circuit board 200 (not shown), or the chip 510 on the second circuit board 500 (See FIG. 1) affected by unnecessary electric effect.

In this embodiment, the electrically conductive film 400 does not cover the first bump 600. In other embodiments, the electrically conductive film 400 can cover the first bump 600, namely, the first bump 600 and the electrically conductive structure 300 can be covered by the electrically conductive film 400. As such, during the process for placing the electrically conductive film 400, the electrically conductive film 400 is not required to keep away from the first bump 600, which simplifies the placing process. When the second circuit board 500 is pressed, the electrically conductive film 400 and the electrically conductive particles 410 therein on the first bump 600 can be pressed into the first groove 620.

In this embodiment, the second circuit board 500 can be, but is not limited to be a flexible printed circuit (FPC). The first circuit board 200 can be, but is not limited to be, a printed circuit board (PCB).

Second Embodiment

Figure 5:
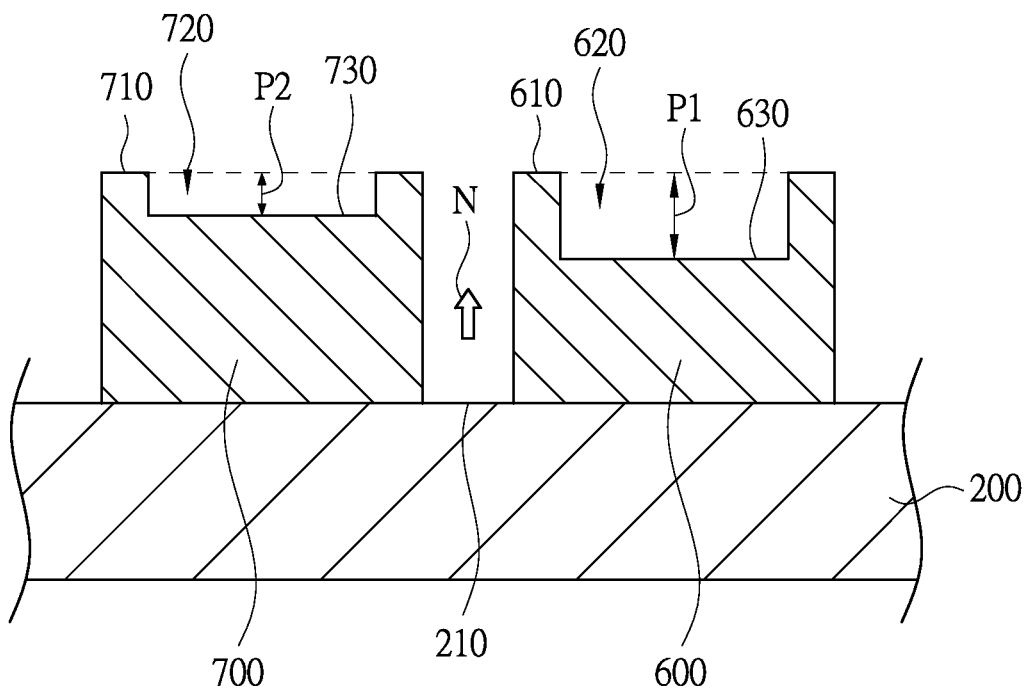
FIG. 5 is partial cross-sectional view of the first circuit board and the bump thereon in accordance with the second embodiment of the present invention.

FIG. 5 is partial cross-sectional view of the first circuit board 200 and the bump thereon in accordance with the second embodiment of the present invention. The main difference between this embodiment and the first embodiment is that the display apparatus in this embodiment includes a second bump 700. The first bump 600 and the second bump 700 are disposed on the supporting surface 210 of the first circuit board 200. The second bump 700 has a top surface 710, a second groove 720 and a dented surface 730. The second groove 720 is disposed on the top surface 710, and the dented surface 730 is positioned in the second groove 720. The first bump 600 is described as the foregoing context, in which the first groove 620 has a maximal depth P1 along the normal direction N of the supporting surface 210. The second groove 720 has a maximal depth P2 along the normal direction N of the supporting surface 210. The maximal depth P1 satisfies: 0.2×D≤P1≤0.8×D, and the maximal depth P2 satisfies: 0<P2<0.2×D, in which "D" is the average particle diameter of the non-deformed electrically conductive particles 410 (See FIG. 2).

When the second circuit board 500 (See FIG. 3) is pressed, and at least one indentation is shown on the second circuit board 500 over the second bump 700 while no indentation is shown on the second circuit board 500 over the first bump 600, it means that the electrically conductive particles 420 (See FIG. 3) are not compressed to the certain extent, which may not electrically connect the electrically conductive structure 300 (See FIG. 3) and the second circuit board 500. Therefore, when the process for pressing the second circuit board 500 is accomplished, the operator can observe whether indentations are shown on the second circuit board 500 over both the first bump 600 and the second bump 700 to determine whether the deformed extent of the electrically conductive particles 420 is enough to make the electrically conductive particles 420 to electrically connect the second circuit board 500 and the electrically conductive structure 300. Further, during the pressing process, the operator can also observe whether only the second circuit board 500 over the second bump 700 has the indentation thereon. When only the second circuit board 500 over the second bump 700 has the indentation thereon, the operator can keep pressing process on the second circuit board 500 until the indentation is shown on the second circuit board 500 over the first bump 600, and then, the operator can stop pressing process on the second circuit board 500.

The other features in this embodiment are as shown in the first embodiment, and therefore, they are not described repeatedly herein.

Third Embodiment

Figure 6:
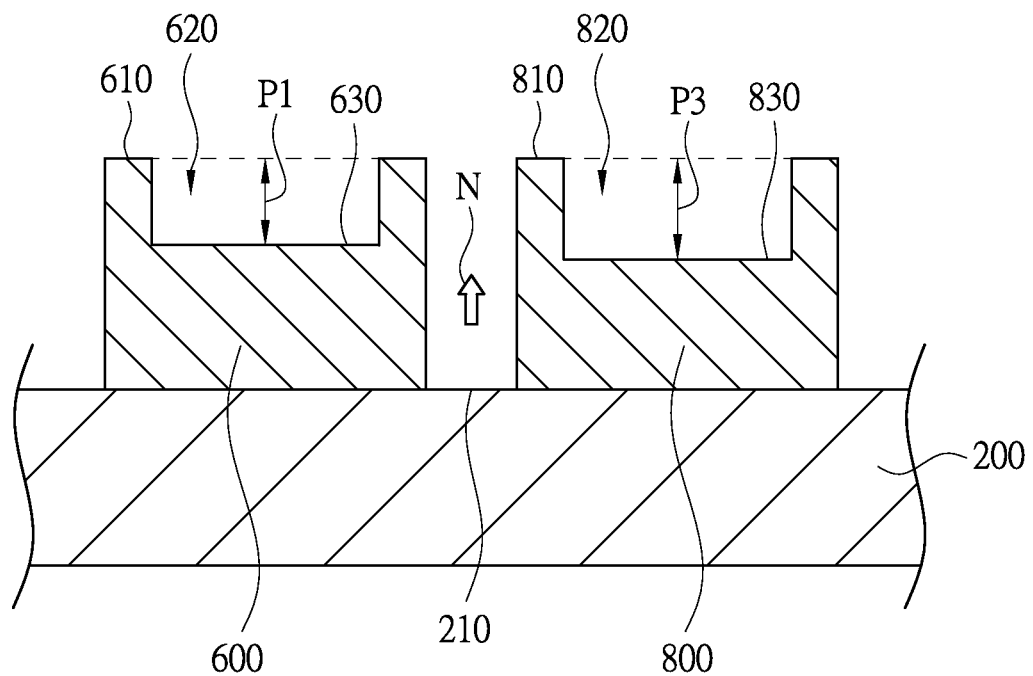
FIG. 6 is partial cross-sectional view of the first circuit board and the bump thereon in accordance with the third embodiment of the present invention.

FIG. 6 is partial cross-sectional view of the first circuit board 200 and the bump thereon in accordance with the third embodiment of the present invention. The main difference between this embodiment and the first embodiment is that the display apparatus in this embodiment includes a third bump 800. The first bump 600 and the third bump 800 are disposed on the supporting surface 210 of the first circuit board 200. The third bump 800 has a top surface 810, a third groove 820 and a dented surface 830. The third groove 820 is disposed on the top surface 810, and the dented surface 830 is positioned in the third groove 820. The first bump 600 is described as the foregoing context, in which the first groove 620 has a maximal depth P1 along the normal direction N of the supporting surface 210. The third groove 820 has a maximal depth P3 along the normal direction N of the supporting surface 210. The maximal depth P1 satisfies: $0.2 \times D \leq P1 \leq 0.8 \times D$, and the maximal depth P3 satisfies: $P3 > 0.8 \times D$, in which "D" is the average particle diameter of the non-deformed electrically conductive particles 410 (See FIG. 2).

When the process for pressing the second circuit board 500 (See FIG. 3) is accomplished, and at least one indentation is shown on the second circuit board 500 over the first bump 600 while no indentation is shown on the second circuit board 500 over the third bump 800, it means that the compressed or deformed ratio (i.e. the term "H/D") of the electrically conductive particles 420 (See FIG. 3) ranges between 0.2~0.8. At this stage, the deformed conductive particles 420 may electrically connect the electrically conductive structure 300 (See FIG. 3) and the second circuit board 500. When the process for pressing the second circuit board 500 is accomplished, and the operator observes that indentations are shown on the second circuit board 500 over both the first bump 600 and the second bump 700, it is determined that the compressed or deformed ratio of the electrically conductive particles 420 is greater than 0.8. At this stage, the deformed electrically conductive particles 420 bear undue pressure, this may cause that the second circuit board 500 does not electrically connect the conductive structure 300.

Further, during the pressing process, when the operator observes that only the first bump 600 has the indentation thereon, and the third bump 800 does not have the indentation thereon, the operator can stop pressing the second circuit board 500.

The other features in this embodiment are as shown in the first embodiment, and therefore, they are not described repeatedly herein.

Fourth Embodiment

Figure 7:
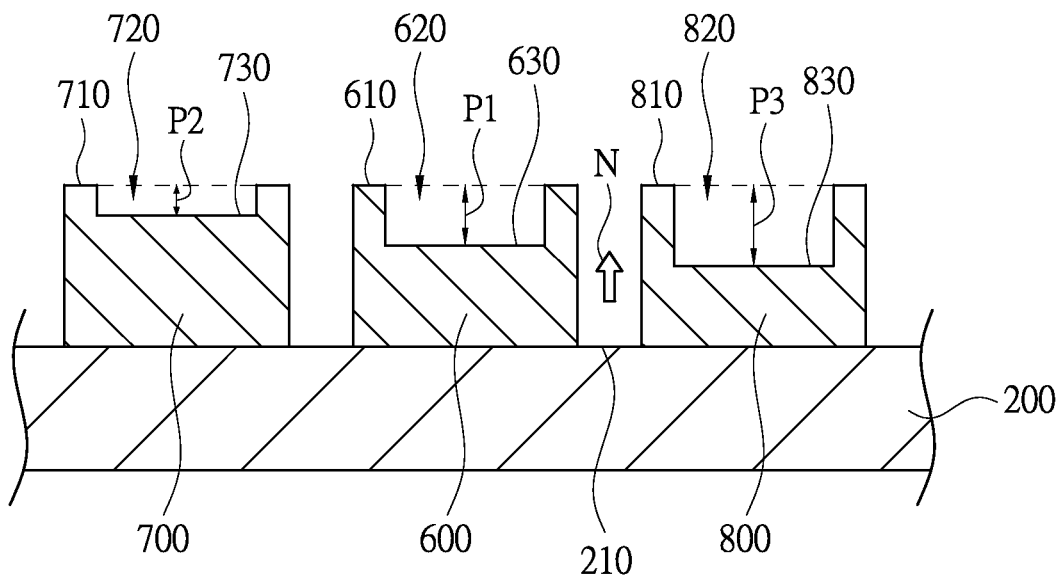
FIG. 7 is partial cross-sectional view of the first circuit board and the bump thereon in accordance with the fourth embodiment of the present invention.

FIG. 7 is partial cross-sectional view of the first circuit board 200 and the bump thereon in accordance with the fourth embodiment of the present invention. The main difference between this embodiment and the first embodiment is that the display apparatus in this embodiment includes a second bump 700 and a third bump 800. The first bump 600, the second bump 700 and the third bump 800 are disposed on the supporting surface 210 of the first circuit board 200. The first bump 600 is described as in the first embodiment, in which the first groove 620 has a maximal depth P1 along the normal direction N of the supporting surface 210. The second bump 700 is described as in the second embodiment, in which the second groove 720 has a maximal depth P2 along the normal direction N of the supporting surface 210. The third bump 800 is described as in the third embodiment, in which the third groove 820 has a maximal depth P3 along the normal direction N of the supporting surface 210. The maximal depth P1 satisfies: $0.2 \times D \leq P1 \leq 0.8 \times D$, the maximal depth P2 satisfies: $0 < P2 < 0.2 \times D$, and the maximal depth P3 satisfies: $P3 > 0.8 \times D$, in which "D" is the average particle diameter of the non-deformed electrically conductive particles 410 (See FIG. 2).

When the process for pressing the second circuit board 500 (See FIG. 3) is accomplished, and only the second bump 700 has the indentation thereon, and the first bump 600 and the third bump 800 do not have the indentation thereon, it means that the deformed electrically conductive particles 420 are not compressed to the certain extent, which may not electrically connect the electrically conductive structure 300 (See FIG. 3) and the second circuit board 500. When the process for pressing the second circuit board 500 is accomplished, the first bump 600 and the second bump 700 both have the indentations thereon, and the third bump 800 does not has the indentation thereon, it means that the deformed electrically conductive particles are compressed to the certain extent and can electrically connect the electrically conductive structure 300 and the second circuit board 500. When the process for pressing the second circuit board 500 is accomplished, the first bump 600, the second bump 700 and the third bump 800 all have indentations thereon, it means that the deformed electrically conductive particles 420 bear undue pressure and may not electrically connect the second circuit board 500 and the electrically conductive structure 300.

Further, during the pressing process, when only the second bump 700 has the indentation thereon, and the first bump 600 does not have the indentation thereon, the operator can keep pressing the second circuit board 500 until the indentation is shown on the second circuit board 500 over the first bump 600, and then, the operator can stop pressing the second circuit board 500 before the indentation is shown on the third bump 800.

The other features in this embodiment are as shown in the first embodiment, and therefore, they are not described repeatedly herein.

Fifth Embodiment

Figure 8:
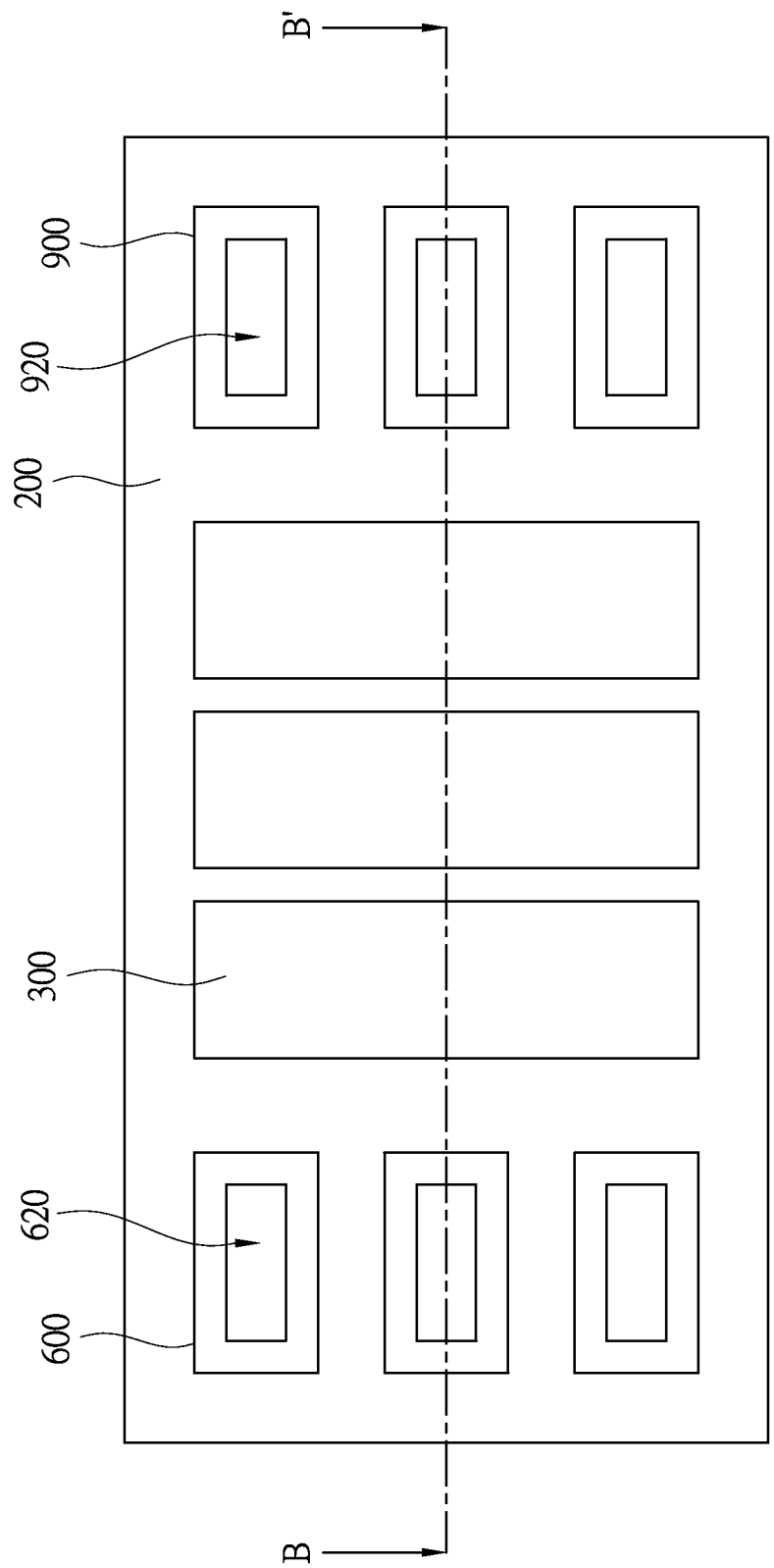
FIG. 8 is a top view of the first circuit board and the electrically conductive structure and the bumps thereon in accordance with the fifth embodiment of the present invention.
Figure 9:
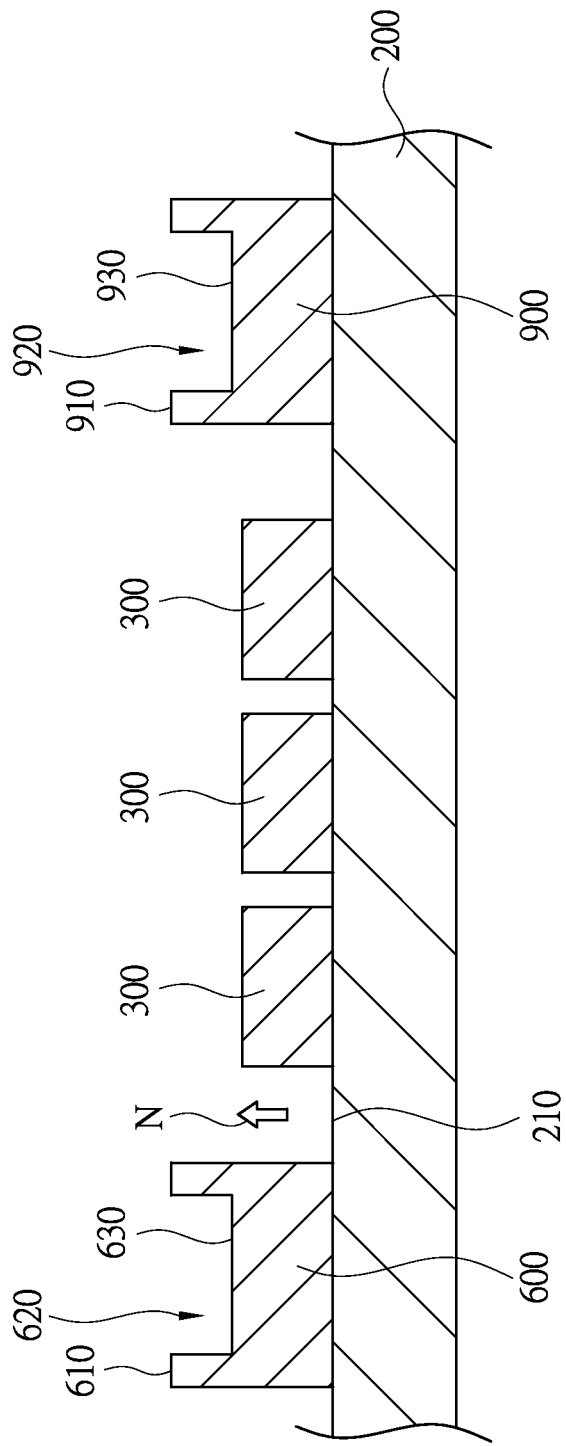
FIG. 9 is a partial cross-sectional view of the first circuit board taken along B-B' line in FIG. 8.

FIG. 8 is a top view of the first circuit board 200 and the electrically conductive structure 300 and the bumps thereon in accordance with the fifth embodiment of the present invention, and FIG. 9 is a partial cross-sectional view of the first circuit board 200 taken along B-B' line in FIG. 8. As shown in FIGS. 8 and 9, the main difference between this embodiment and the first embodiment is that the display apparatus in this embodiment includes a fourth bump 900. The first bump 600 and the fourth bump 900 are disposed on the supporting surface, and they are respectively positioned on two opposite sides of the electrically conductive structure 300. The first bump 600 and the fourth bump 900 can be symmetrically disposed. In other words, the minimal distance between the first bump 600 and the electrically conductive structure 300 can be equal to the minimal distance between the fourth bump 900 and the electrically conductive structure 300.

The fourth bump 900 includes a top surface 910, a fourth groove 920 and a dented surface 930. The fourth groove 920 is disposed on the top surface 910, and dented surface 930 is positioned in the fourth groove 920. The first bump 600 is described as in the first embodiment. The depth of the first groove 620 of the first bump 600 and the depth of the fourth groove 920 of the fourth 900 can be equal, so as to facilitate the operator to determine whether the depths pressed on opposite sides of the electrically conductive structures 300 are equal, thereby determining whether the deformed extent of all the electrically conductive particles 420 (See FIG. 3) are equal.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A circuit board module, comprising:
a first circuit board having a supporting surface, the supporting surface having a normal direction, the first circuit board comprising:
an electrically conductive structure disposed on the supporting surface, the electrically conductive structure having a first maximal thickness T1 along the normal direction of the supporting surface;
a first bump disposed on the supporting surface, the first bump having a second maximal thickness T2 along the normal direction of the supporting surface, the first bump having a top surface and a first groove, wherein the top surface is opposite to the supporting surface, and the first groove is disposed on the top surface;
a second circuit board disposed on the electrically conductive structure and the first bump; and
an electrically conductive film disposed between the second circuit board and the electrically conductive structure, the electrically conductive film having a plurality of electrically conductive particles, an average particle diameter D of the electrically conductive particles satisfies: 0<T2−T1≤D when undeformed.

2. The circuit board module of claim 1, wherein a portion of the second circuit board is received in the first groove.

3. The circuit board module of claim 2, wherein the first bump has a dented surface positioned in the first groove, and the portion of the second circuit board received in the first groove is against the dented surface.

4. The circuit board module of claim 1, wherein the first groove has a maximal depth P1 along the normal direction of the supporting surface, wherein the maximal depth P1 satisfies: 0.2×D≤P1≤0.8×D.

5. The circuit board module of claim 1, further comprising:
a second bump disposed on the supporting surface, wherein the second bump has a second groove, wherein the first groove and the second groove respectively have a maximal depth P1 and a maximal depth P2 along the normal direction of the supporting surface, wherein the maximal depth P1 satisfies: 0.2×D≤P1≤0.8×D, and the maximal depth P2 satisfies: 0<P2<0.2×D.

6. The circuit board module of claim 1, further comprising:
a third bump disposed on the supporting surface, wherein the third bump has a third groove, wherein the first groove and the third groove respectively have a maximal depth P1 and a maximal depth P3 along the normal direction of the supporting surface, wherein the maximal depth P1 satisfies: 0.2×D≤P1≤0.8×D, and the maximal depth P3 satisfies: P3>0.8×D.

7. The circuit board module of claim 1, further comprising:
a second bump disposed on the supporting surface, wherein the second bump has a second groove; and
a third bump disposed on the supporting surface, wherein the third bump has a third groove, wherein the first groove, the second groove and the third groove respectively have a maximal depth P1, a maximal depth P2 and a maximal depth P3 along the normal direction of the supporting surface, wherein the maximal depth P1 satisfies: 0.2×D≤P1≤0.8×D, the maximal depth P2 satisfies: 0<P2<0.2×D, and the maximal depth P3 satisfies: P3>0.8×D.

8. The circuit board module of claim 1, further comprising:
a fourth bump disposed on the supporting surface, wherein the fourth bump has a fourth groove, wherein the first bump and the fourth bump are respectively positioned on two opposite sides of the electrically conductive structure.

9. The circuit board module of claim 1, wherein the difference between the second maximal thickness T2 and the first maximal thickness T1 is substantially equal to the average particle diameter D.

10. A display apparatus, comprising:
a display panel;
a first circuit board;
a second circuit board connecting the display panel and the first circuit board, wherein the first circuit board has a supporting surface, and the supporting surface has a normal direction;
an electrically conductive structure disposed on the supporting surface, the electrically conductive structure having a first maximal thickness T1 along the normal direction of the supporting surface;
a first bump disposed on the supporting surface, the first bump having a second maximal thickness T2 along the normal direction of the supporting surface, the first bump having a top surface and a first groove, wherein the top surface is opposite to the supporting surface, and the first groove is disposed on the top surface; and
an electrically conductive film disposed between the second circuit board and the electrically conductive structure, the electrically conductive film having a plurality of conductive particles, an average particle diameter D of the conductive particles satisfies: 0<T2−T1≤D when undeformed.

11. The display apparatus of claim 10, wherein a portion of the second circuit board is received in the first groove.

12. The display apparatus of claim 11, wherein the first bump has a dented surface positioned in the first groove, and the portion of the second circuit board received in the first groove is against the dented surface.

13. The display apparatus of claim 10, wherein the first groove has a maximal depth P1 along the normal direction of the supporting surface, wherein the maximal depth P1 satisfies: 0.2×D≤P1≤0.8×D.

14. The display apparatus of claim 10, further comprising:
a second bump disposed on the supporting surface, wherein the second bump has a second groove, wherein the first groove and the second groove respectively have a maximal depth P1 and a maximal depth P2 along the normal direction of the supporting surface, wherein the maximal depth P1 satisfies: 0.2×D≤P1≤0.8×D, and the maximal depth P2 satisfies: 0<P2<0.2×D.

15. The display apparatus of claim 10, further comprising:
a third bump disposed on the supporting surface, wherein the third bump has a third groove, wherein the first groove and the third groove respectively have a maximal depth P1 and a maximal depth P3 along the normal direction of the supporting surface, wherein the maximal depth P1 satisfies: 0.2×D≤P1≤0.8×D, and the maximal depth P3 satisfies: P3>0.8×D.

16. The display apparatus of claim 10, further comprising:
a second bump disposed on the supporting surface, wherein the second bump has a second groove; and
a third bump disposed on the supporting surface, wherein the third bump has a third groove, wherein the first groove, the second groove and the third groove respectively have a maximal depth P1, a maximal depth P2 and a maximal depth P3 along the normal direction of the supporting surface, wherein the maximal depth P1 satisfies: 0.2×D≤P1≤0.8×D, the maximal depth P2 satisfies: 0<P2<0.2×D, and the maximal depth P3 satisfies: P3>0.8×D.

17. The display apparatus of claim 10, further comprising:
a fourth bump disposed on the supporting surface, wherein the fourth bump has a fourth groove, wherein the first bump and the fourth bump are respectively positioned on two opposite sides of the electrically conductive structure.

18. The display apparatus of claim 10, wherein the difference between the second maximal thickness T2 and the first maximal thickness T1 is substantially equal to the average particle diameter D.

* * * * *